(12) United States Patent
Lyden

(10) Patent No.: US 6,515,606 B2
(45) Date of Patent: Feb. 4, 2003

(54) ANALOG TO DIGITAL CONVERTER

(75) Inventor: Colin Lyden, Co. Cork (IE)

(73) Assignee: University College-Cork National University of Ireland, Cork (IE)

( * ) Notice: Subject to any disclaimer, the term of this patent is extended or adjusted under 35 U.S.C. 154(b) by 0 days.

(21) Appl. No.: 09/963,540

(22) Filed: Sep. 27, 2001

(65) Prior Publication Data

US 2002/0039077 A1 Apr. 4, 2002

(30) Foreign Application Priority Data

Sep. 29, 2000 (IE) .......................... S2000/0786

(51) Int. Cl.[7] .............................. H03M 3/00; H03M 1/12
(52) U.S. Cl. ...................... 341/143; 341/144; 341/155; 341/161; 341/162
(58) Field of Search ................................ 341/143, 144, 341/155, 161, 162

(56) References Cited

U.S. PATENT DOCUMENTS

| | | | |
|---|---|---|---|
| 4,704,600 A | | 11/1987 | Uchimura et al. |
| 4,772,871 A | | 9/1988 | Suzuki et al. |
| 4,876,542 A | | 10/1989 | van Bavel et al. |
| 5,274,374 A | * | 12/1993 | Powell et al. ............... 341/143 |
| 5,311,181 A | * | 5/1994 | Ferguson et al. ............ 341/143 |
| 5,369,403 A | * | 11/1994 | Temes et al. ................ 341/143 |
| 5,936,562 A | * | 8/1999 | Brooks et al. ............... 341/143 |
| 5,982,313 A | * | 11/1999 | Brooks et al. ............... 341/143 |
| 5,986,595 A | | 11/1999 | Lyden et al. |
| 6,061,008 A | * | 5/2000 | Abbey ......................... 341/143 |
| 6,137,430 A | | 10/2000 | Lyden et al. |
| 6,188,345 B1 | * | 2/2001 | McDonald et al. .......... 341/143 |
| 6,243,034 B1 | * | 6/2001 | Regier ......................... 341/155 |

OTHER PUBLICATIONS

Thomas Byunghak CHO, "A 10 b, 20 Msample/s, 35 mW Pipeline A/D Converter," IEEE Journal of Solid State Circuits, V. 30, 1995, pp. 3–9.

Shahriar Rabji, "A 1.8–V Digital–Audio Sigma–Delta Modulator in 0.8–μm CMOS," IEEE Journal of Solid State Circuits, V. 32, 1997, pp. 10–23.

* cited by examiner

Primary Examiner—Michael Tokar
Assistant Examiner—Lam T. Mai
(74) Attorney, Agent, or Firm—Young & Thompson

(57) ABSTRACT

An analog to digital converter for converting an analog input signal to a digital output signal, includes a first converter having a filter unit for producing at least one filter output signal by filtering the difference between the analog input signal and a feedback signal generated from a first digital output, a quantizer for producing the first digital output by quantizing the weighted sum of a first filter output from the filter unit and the analog input signal, a second converter for producing a second digital output by converting a second filter output from the filter unit, and a digital combiner for combining the first output digital signal and the second output digital signal into the digital output signal.

14 Claims, 7 Drawing Sheets

Digital Output —— 77

ANALOG TO DIGITAL CONVERTER

BACKGROUND OF THE INVENTION

1. Field of the Invention

This invention relates to analog to digital converters and in particular, sigma delta modulators. In particular, the invention relates to the incorporation of features from sigma delta modulators into converters of the kind known as pipelined or subranging converters, as described hereinbelow.

2. Description of the Prior Art

Sigma delta modulators are described by, for example, Cho and Gray, JSSC March 1995 pp 166–172, and pipelined (also called subranging) converters, described by, for example, Rabii and Wooley, JSSC June 1997 pp 783–795, are used widely for applications where resolutions in the range 10 to 14 bits are required. In certain applications, it is desirable to sample the input signal at a rate higher than the Nyquist rate, to simplify anti-aliasing, or for other reasons. The extent to which the actual sampling rate exceeds the rate specified by the Nyquist criterion is known as the oversampling ratio (OSR). In general subranging converters are preferred where the highest speed of conversions is required and sigma delta converters are preferred for lower speed where a significant level of oversampling is possible.

In the following sections the sigma delta and subranging converters from the prior art are described in more detail. A new structure combining the advantages of sigma delta and subranging converters is then described.

Subranging Converter

A single stage subranging converter (some times called a half flash converter) is illustrated in FIG. 1. It consists of first converter comprising an input signal sampler indicated by Vin at reference 1, a coarse quantizer, (Q1) 2, a digital to analog converter (DAC) 3, a summing node 4, a sample and hold amplifier 5, and a second converter (quantizer Q2) 6. Note that the thin lines in the figures represent analog signals whereas the thicker lines represent digital signals. The input to the DAC 3 comes directly from the coarse quantizer 2. The input signal Vin is quantized by the coarse quantizer 2 at the same time as it is sampled. The output of the DAC 3 is subtracted from the sampled input signal Vin at the summing node 4, ensuring that only a residue, the difference between the input quantizer and a coarse estimate of that input sample Vin, is passed to the sample and hold amplifier 5. This residue will be much smaller than the input signal Vin. For instance, if the coarse quantizer 2 has a resolution of 4 bits, the magnitude of the residues will be limited to 1/16 of the maximum magnitude of the input signal Vin. In this residue is passed through the sample and hold amplifier 5 and further quantized by the second quantizer 6. As the input range of this second quantizer 6 is quite small, the second quantizer 6 itself can be quite small. The net effect is that the total quantization is broken down into two steps, coarse quantization and fine quantization, with the final output being obtained from the digital combiner 9 which uses the sum of the two steps (i.e. the sum of the outputs from the two quantizers) with appropriate delays to account for time differences in outputs from the first quantizers and second quantizer for the same input samples. For instance, a net 8 bit quantization can be achieved with a 4 bit coarse quantizer 2 and DAC 3 and a 4 bit second quantizer 6. It may he noted that the summing function 4 dues not require special hardware, and happens automatically at the input to the sample and hold amplifier 5.

Three practical implementation issues may be mentioned. Firstly, it is common practice to design the second quantizer 6 with a range larger than the nominal range of the residue by a factor of 1 bit. This redundancy is referred to as interstage 'overlap'. This overlap allows for imperfections in the coarse quantizer 2. Secondly, the DAC 3 must have an accuracy equal to the overall system accuracy, even though this is in excess of the resolution of the DAC 3. Thirdly, it is common practice to provide signal gain in the sample and hold amplifier 5, as this cases the accuracy constraints on the second quantizer 6. Thus, a practical 7 bit subranging converter might consist of two 4 bit accurate 4 bit quantizers 2 and 6, an 8 bit accurate 4 bit DAC 3, and an amplifier 5 with a closed loop gain of 16. There are complex design trade-offs in the choice of amplifier gain, since higher gains result in slower amplifier settling times and hence a lower overall speed of operation. Although, subranging converters are efficient at Nyquist rate sampling, they benefit very little from oversampling.

Where the required resolution exceeds 8 bits, it is common to cascade subranging converter stages. In this arrangement, the second quantizer 6 will itself consist of a subranging converter, so that the quantization is shared over three or more quantizers.

Sigma Delta Modulator

A first order sigma delta modulator from the prior art is illustrated in FIG. 2. It consists of an input sampler at reference 11, the input being Vin, a DAC 17, a summing node 18, a filter means, which in the example shown is an amplifier 15 configured as an integrator, and a coarse quantizer 12. This coarse quantizer 12 will often consist of a single comparator. The input to DAC 17 comes directly from the coarse quantizer 12. The output of the filter means (integrator) 15 is quantized by the coarse quantizer 12, and fed back through the DAC 17 to the summing node 18, where it is subtracted from the input sample Vin. The output from the course quantizer is also the digital output from the sigma delta converter, although further processing may be done on the signal using digital circuitry. Several techniques are known in the prior art to improve the noise performance of sigma delta converters by implementing bit shuffling in the DAC, see for example Irish Patent Nos. 80450 and S970941. Sigma delta modulators are typically operated at a rate much higher than set by the Nyquist criterion. The combination of negative feedback and the signal gain at low frequencies provided by the integrator 15, ensures that the feedback signal matches the input signal Vin at low frequencies. The accuracy of the low frequency matching between feedback and input signals will exceed the resolution of the coarse quantizer 12.

Several other filter means may be used in place of a single integrator, for example two integrators may be used in series. Different filter means may be chosen depending on the required parameters for a given situation, examples of these parameters would include the frequency response of the converter, the Signal to Noise ratio and loop stability of the converter.

A detailed analysis of the operation of sigma delta modulators is complex, see for example, "Delta-sigma Data Converters—Theory, Design and Simulation", eds. S. R. Norsworthy, R Schreier and G. C. Temes, IEEE Press 1997, ISBN 0-7803-1045-4. However, computer simulations indicate that a first order modulator of the type shown is in FIG. 2, with a 3 bit quantizer 12 and a 3 bit DAC 17, will achieve a resolution of 8 bits, at an oversampling ratio of 64. This resolution will increase by 1.5 bits for every 1 bit increase in the oversampling ratio. If a higher resolution is required at a lower oversampling ratio, then the quantizer resolution must be increased, or a higher order modulator used, as is described in the above-mentioned "Delta-sigma Data Converters—Theory, Design and Simulation". Alternatively, if a higher oversampling rate is possible, then the quantizer resolution can be reduced while maintaining the same overall system resolution.

Comparison of Sigma Delta and Subranging Converters

It is informative to compare the two foregoing exemplary data converters under the headings of number of quantizers, effect of oversampling, and stage gain.

Number of Quantizers

In the subranging converter of FIG. 1, the quantization is spread over two stages, whereas in the sigma delta modulator, see FIG. 2, all of the quantization must be done in one stage. As, in general, two N/2 bit quantizers require much less circuitry than one N bit quantizer, the subranging converter is preferable from this aspect. A number of prior art sigma delta modulators use multiple quantizers, for example U.S. Pat. No. 4,876,542, U.S. Pat. No. 4,772,871 and U.S. Pat. No. 4,704,600, but these suffer from a number of disadvantages which will be discussed with reference to the invention below.

Effect of Oversampling

In the sigma delta modulator, the resolution increases by 1.5 bits for every increase in OSR by a multiple of two. In the subranging converter, the increase in resolution is only 0.5 bits for every increase in OSR by a multiple of two. Thus the sigma delta modulator is preferable from this aspect. Simulations indicate that this advantage applies as long as OSR>2.

Stage Gain

In the subranging converter, the design of the second quantizer 6 is greatly simplified if the residue signal is amplified. Unfortunately, an amplifier closed loop gain greater than unity increases the amplifier settling time and results in a reduced maximum speed of operation. By contrast, in the sigma delta modulator, the intrinsic operation of the integrator provides signal gain, if OSR>2, so the amplifiers are normally designed with a closed loop gain close to unity. Thus the sigma delta modulator is preferable in this aspect, if OSR>2.

BRIEF SUMMARY OF THE INVENTION

According to the invention, there is provided a novel analog to digital converter for converting an analog input signal to an output digital signal which combines the advantages of subranging and sigma delta structures.

In particular, there is provided an analog to digital converter for converting an analog input signal to a digital output signal, comprising a first converter which comprises a filter means for producing at least one filter output signal by filtering the difference between the analog input signal and a feedback signal generated from a first digital output, a quantizer for producing the first digital output by quantizing the weighted sum of a first filter output from the first filter means and the analog input signal, a second converter for producing a second digital output by converting a second filter output from the filter means, and a digital combiner for combining the first output digital signal and the second output digital signal into the digital output signal.

The digital combiner may include a differentiator for differentiating the second digital output before combining the first digital output and second digital output into the digital output signal.

The digital combiner may include a delay element for delaying the first digital output before combining the first digital output and second digital output into the digital output signal.

The first filter means may comprise at least one integrator. The first filter output and second filter output may be the same.

The digital combiner may include a differentiator for differentiating the second digital output before combining the first digital output and second digital output into the digital output signal In one embodiment the first filter means comprises two integrators in series, wherein the output of the first integrator is the input to the second integrator and the second filter output is the output of the second integrator. In this embodiment the first filter output may be a weighted combination of the outputs from the first integrator and second integrator. In this embodiment the digital combiner may include a double differentiator for differentiating the second digital output twice before combining the first digital output and second digital output into the digital output signal and/or a delay element for delaying the first digital output before combining the first digital output and second digital output into the digital output signal.

In a further embodiment the second converter comprises a second filter means for producing at least one filter output signal by filtering the difference between the analog input signal and a feedback signal generated from a first digital output, a quantifier for producing the second digital output by quantizing the weighted sum of a third filter output from the second filter means and the analog input signal. In this further embodiment, a third converter may be provided for producing a third digital output by converting a second filter output from the second filter means, and the digital combiner includes means for combining the third digital signal with the first output digital signal and the second output digital signal into the digital output signal. The digital combiner may include delay elements for delaying the first digital output and second digital output before combining the first digital output, second digital output and third digital output into the digital output signal and/or a differentiator for differentiating the second digital output and a double differentiator for differentiating the third digital signal before combining the first digital output, second digital output and third digital output into the digital output signal.

DETAILED DESCRIPTION OF THE DRAWINGS

Figure 3:
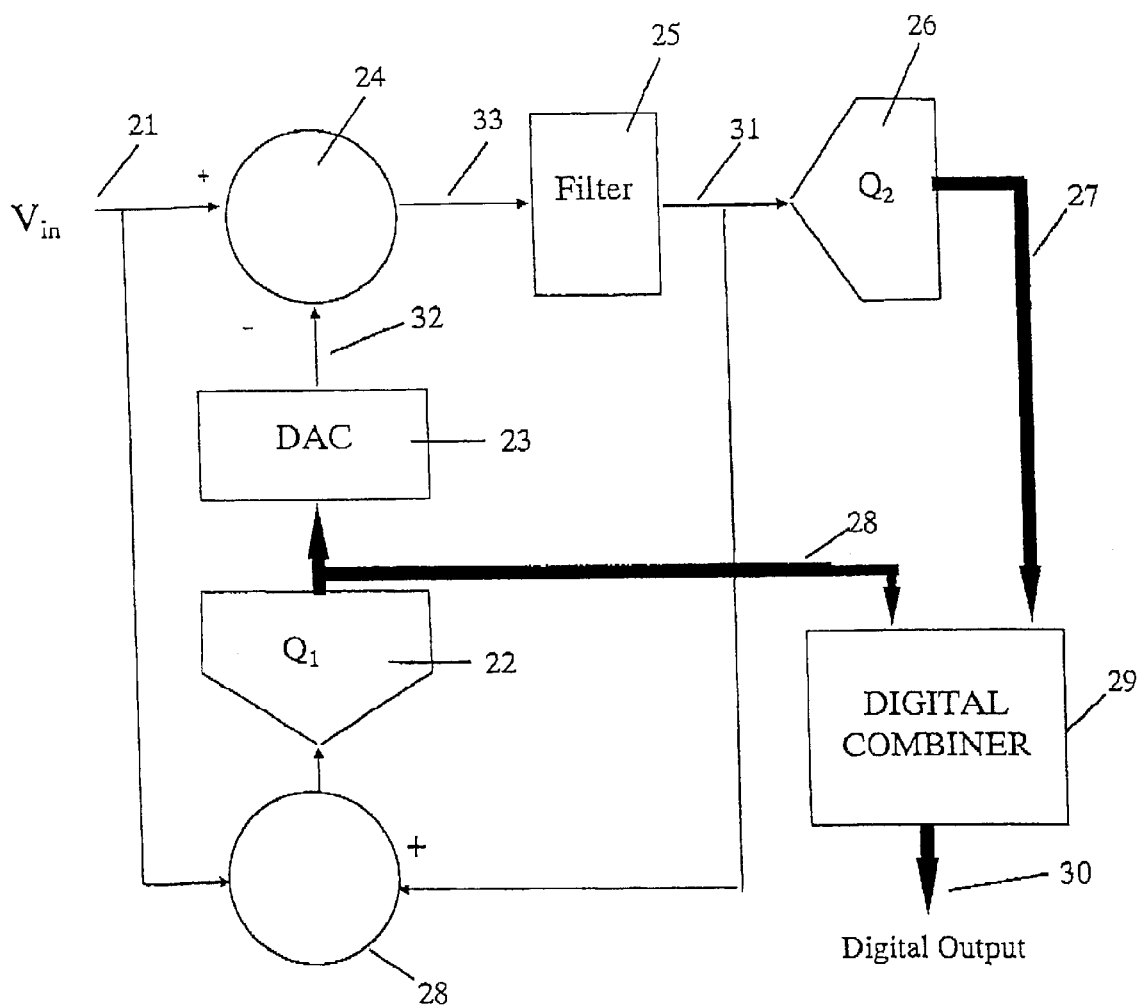
FIG. 3 shows a subranging sigma delta modulator according to the invention.

The present invention combines the advantages of subranging and sigma delta structures in the novel circuit shown in FIG. 3. It can be seen as a modification of a subranging, converter such as that of FIG. 1, with the sample and hold amplifier 5 of the first converter in FIG. 1 replaced by a filter (for example an integrator) 25 and with the introduction of an extra path 31 from the output of filter 25 to the input of coarse quantizer 22. The input of coarse quantizer 22 is now the sum of the input signal Vin at reference 21 and the output 31 of filter 25. The course quantizer 22 produces a first digital output signal 28, which is converted by the DAC to a corresponding analog signal 32. The difference between the input signal Vin at reference 21 and the corresponding analog signal 32 becomes the input to the integrator. The output of the filter 31 is provided as the input to the second quantizer 26, which produces a second digital output 27. The digital outputs of the two quantizers 22 and 26 are combined in the digital combiner 29, to produce the overall digital output. A suitable digital combiner would differentiate the second digital output 26 and add it to the output 28. Appropriate delays may be required to ensure that the first and second digital signals correspond when added.

Figure 1:
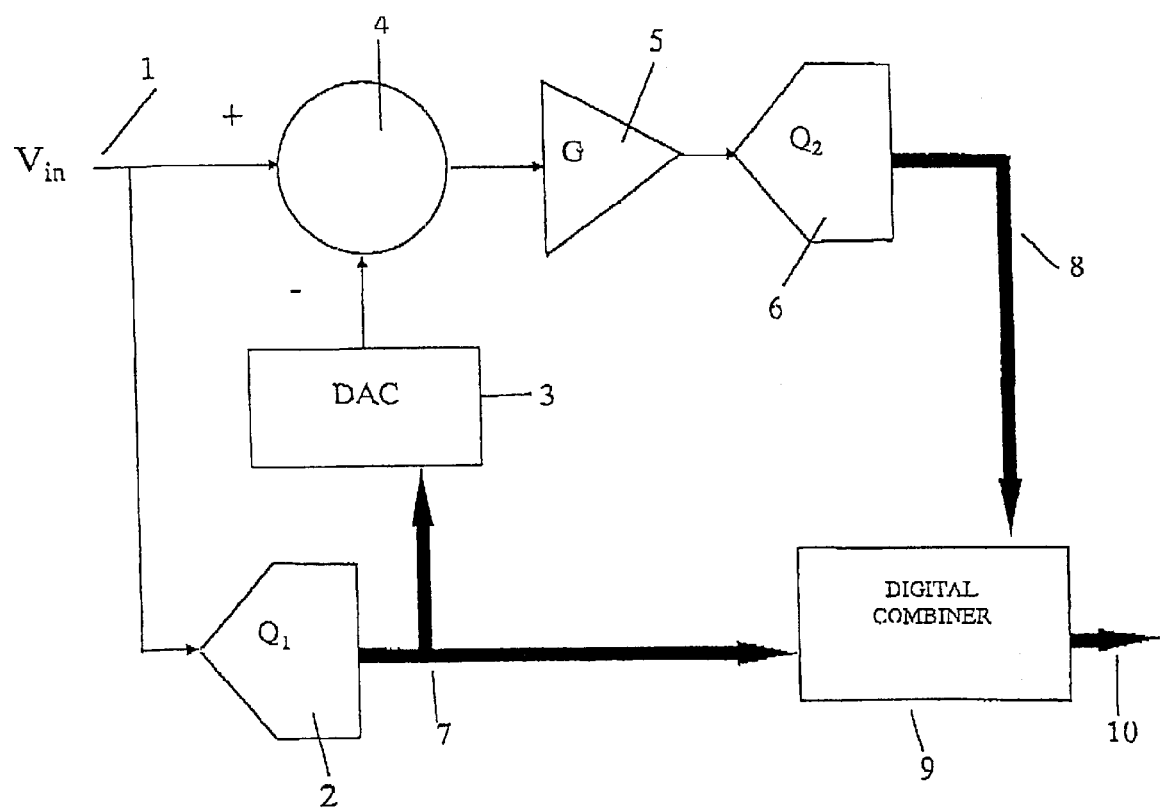
FIG. 1 shows a subranging converter from the prior art.

The subranging converter of FIG. 1 has thus now been changed to a kind of sigma delta modulator, since the amplifier (5 in FIG. 1) of the first converter is replaced by a filter (25 in FIG. 3) (in the present example an integrator, with negative feedback of the output of integrator 25 to its input). The incorporation of the filter which may be an amplifier 25 implemented as an integrator, benefits from increasing resolution with increasing OSR, and increasing in-band signal gain with increasing OSR. In addition tolerance to op-amp (integrator) non-idealities are improved, provided sufficient over sampling is used. This improvement may be sufficient to remove the requirement for interstage overlap. Furthermore, as the op amp of the subranging converter has become an integrator, a lower closed loop gain is acceptable. This results in faster settling times. Alternatively, the novel circuit of FIG. 3 can be seen as a modification of the existing sigma delta modulator (FIG. 2) by the addition of subranging: a coarse quantizer 22 has been introduced at the input, ensuring that only a residual signal is presented to the input of the filter (integrator) 25. This reduces the output signal range of the integrator 25 to approximately one LSB of the course quantizer 22 (least significant bit) of the input signal Vin (assuming unity gain in the filter). A second quantizer 26 quantizes the output of the filter 25. Thus, the main advantages of the subranging converter, distribution of quantization over two quantizers and reduction of the magnitude of the signal presented to the amplifier, have been achieved in a sigma delta modulator.

Circuit Complexity Comparison

Consider an example where 10 bit resolution is required and the OSR=16.

Subranging Converter (FIG. 1)

With appropriate use of low pass filtering, 2 bits of quantization will be provided by the averaging of quantization noise at OSR=16. The remaining 8 bits, plus 1 bit for overlap, can be divided as 4 bits for the coarse quantizer 2 and 5 bits for the second quantizer 6. If the quantizers 2, 6 are implemented as flash ADCs, then a total of 46 comparators will be used, in addition to a 4 bit DAC 3 and the amplifier 5. The closed loop gain of the amplifier 5 would typically be set in the region of 4 to 16.

Figure 2:
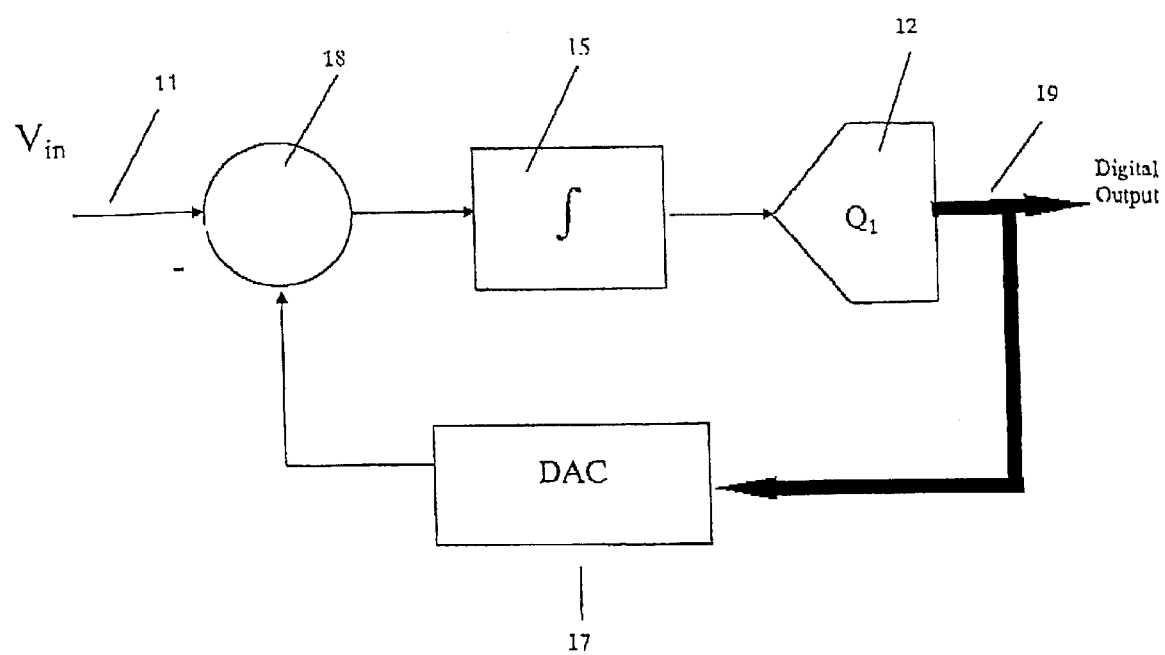
FIG. 2 shows a first order sigma delta modulator.

First Order Sigma Delta Modulator (FIG. 2)

With a first order sigma delta modulator, oversampling by 16 will provide 5 bits of resolution. A further 5 bits must be realised by direct quantization. Thus a total of 31 comparators, plus a 5 bit DAC 17 and an amplifier 12, would be required. The closed loop gain of the amplifier 12 would typically be set to 1 or 2. (DAC 27) and an amplifier 25, would be required. The closed loop gain of the amplifier 25 would typically be set to 1 or 2. A significant advantage of this new architecture is that the comparator count is very significantly reduced compared to the two examples from the prior art. This reduction in comparator count results in a smaller space requirement on an integrated circuit, providing greater space for other circuitry. The reduction in comparator count also results in circuits that have a lower power consumption than presently available.

Figure 4:
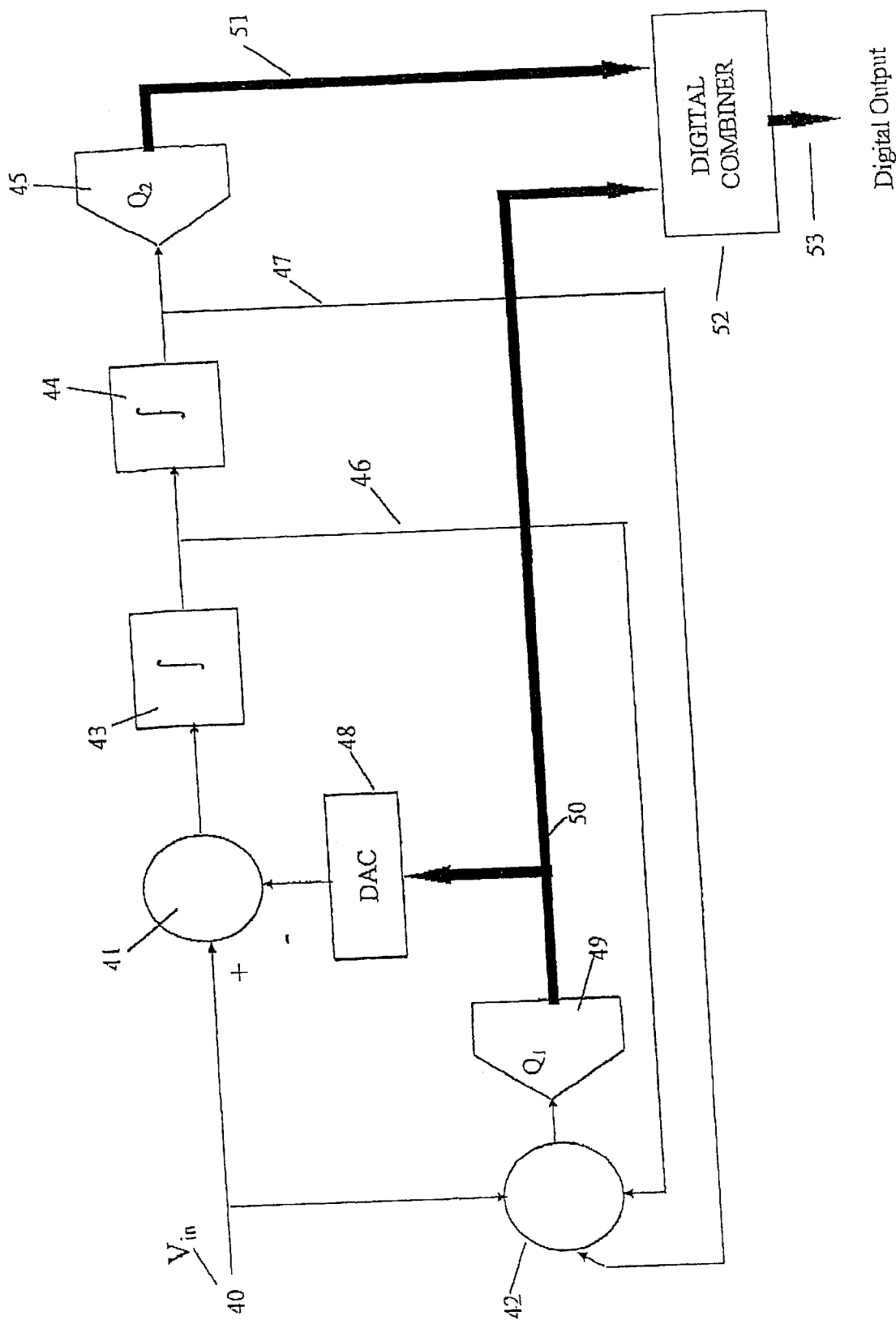
FIG. 4 shows a further subranging sigma delta modulator according to the invention.

One embodiment of the invention of FIG. 3 is shown in FIG. 4, in which the filter 25 of FIG. 3 is implemented as two integrators 43, 44 in series. The feedback signal from the filter 25 is a weighted combination of the output signal 46 from the first integrator 43 and the output signal 47 from the second integrator 44. The weighting factors are chosen appropriately to provide a particular operating characteristic for the converter. Methods for selecting appropriate weighting factors are well known in the art. As before the feedback signal is subtracted from the input voltage 40 and the resulting signal quantized by a coarse quantizer 49 into a first digital output 50. The digital output 50 of the coarse quantizer is converted to an analog equivalent signal by the DAC 48. The input to the first integrator 43 is the difference (implemented in summer 41) between the output of the DAC 48 and the analog input voltage 40. The output 46 of the first integrator 43 is provided as an input to the second integrator 44. The output 47 of the second integrator 44 (second filter output) is converted by the second quantizer 45 to a second digital signal 51. The first digital output signal 50 and the second digital output signal 51 are combined in the digital combiner 52 to produce a digital output 53. A suitable digital combiner is shown in FIG. 51 in which the second output digital signal 51 is differentiated twice 56 and then added to the first digital signal 50. Delays may be required to ensure that when the first digital signal and second digital signal arrive at the summer 57, they are in sync.

Figure 6:
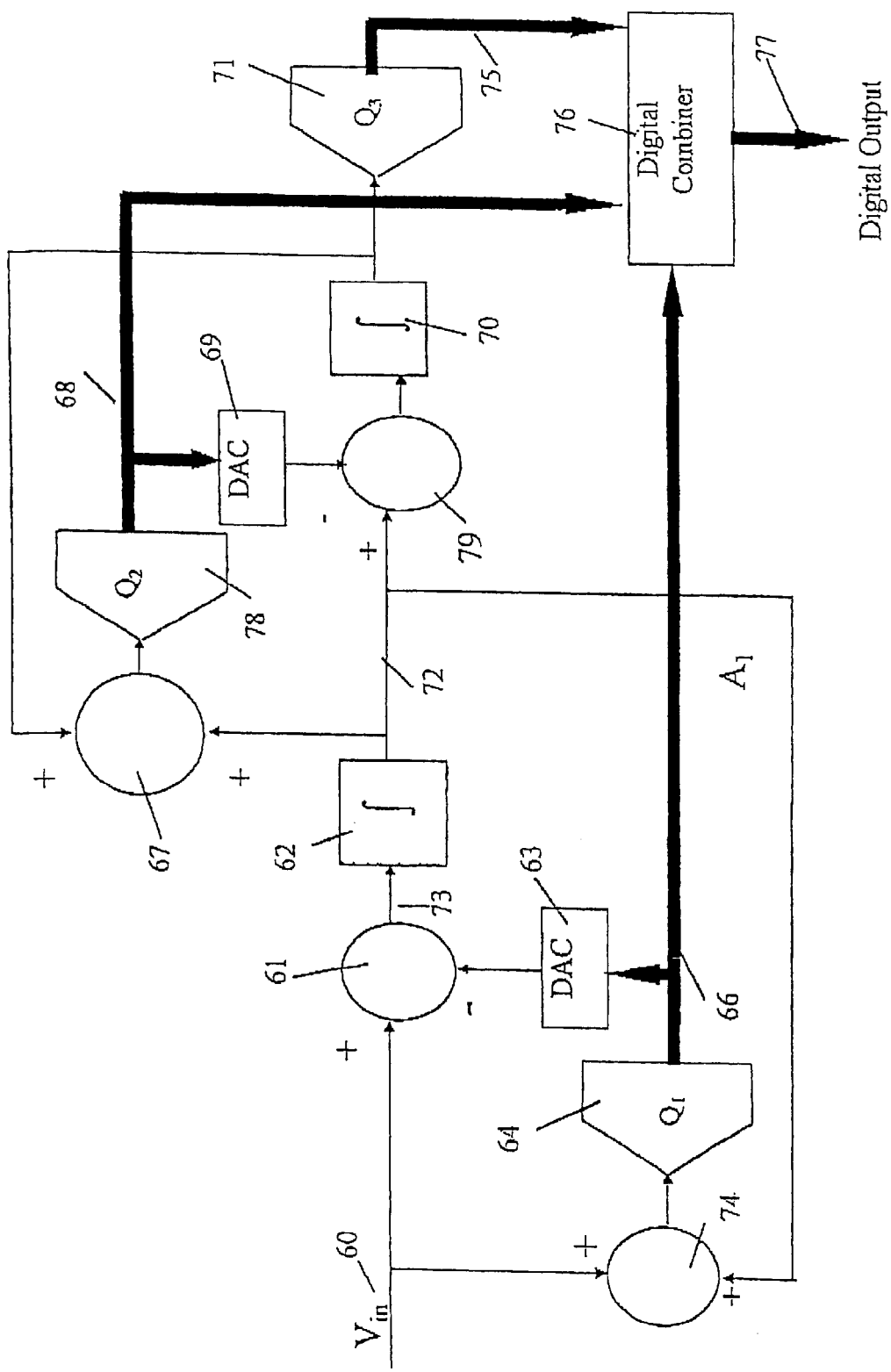
FIG. 6 shows another subranging sigma delta modulator according to the invention.

A further embodiment of a subranging sigma-delta modulator is accordance with the invention is shown in FIG. 6, in which the second converter has been modified from a simple quantizer to a structure similar to that of the first converter with an additional quantizer 71 provided, which converts an output from the filter 70 of the second converter into a third digital signal.

The first part of the circuit of FIG. 6 incorporating the first summer 61, second summer 74, course quantizer 64, first DAC 62, and filter (integrator) 62 function as per the first summer 24, second summer 20, course quantizer 22, DAC 23 and filter 25 of FIG. 3.

The fine quantizer 26 of FIG. 3 has been replaced by a structure similar to the structure of FIG. 3.

Figure 7:
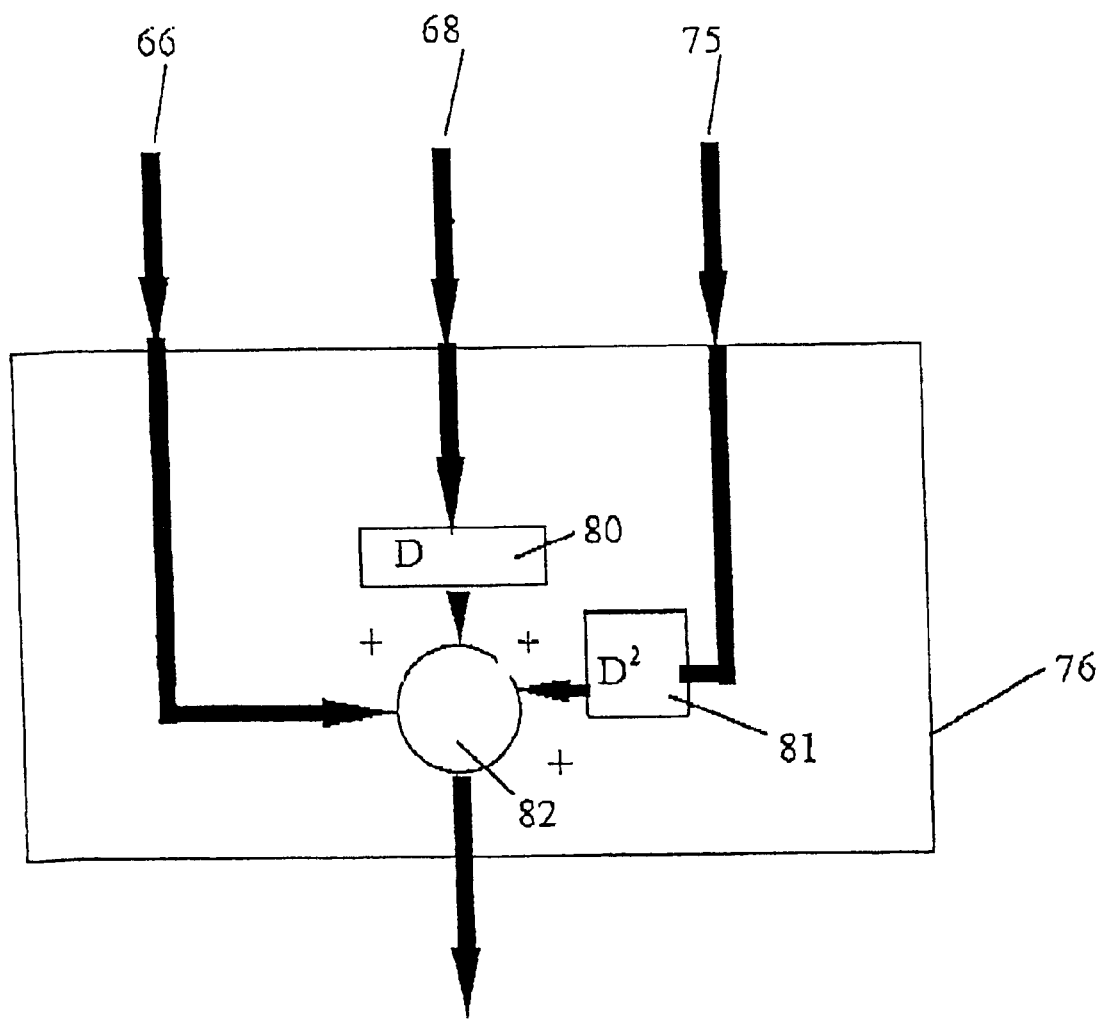
FIG. 7 shows a digital combiner from the subranging sigma delta modulator of FIG. 6.

The input of the second coarse quantizer 78 in FIG. 6 is the sum of a filter output 72 from the first filter 62 and a feedback signal of the second filter 70. This second quantizer 78 produces a second digital output signal 68, which is converted by the second DAC to a corresponding analog signal. The difference between the output of the first filter 68 and the corresponding analog signal becomes the input to the second filter 70 (integrator). The output of the second filter 70 is provided as the input to a third quantizer 71, which produces a third digital output 75. The digital outputs of the three quantizers 64, 78 and 75 are combined in the digital combiner 76 to produce the overall digital output. A suitable digital combiner shown in FIG. 7 would differentiate the second digital output 68, differentiate the output of the third quantizer twice, and add these to the output of the first quantizer 66. Appropriate delays may be required to ensure that the first and second digital signals correspond when added.

The present invention differs significantly from the prior art. In the prior art, the input to each quantizer is the output of its associated integrator and the output of each quantizer determines the loop's feedback signal. In the present invention, the input to the quantizer that determines the feedback signal is the sum of the integrator output plus the input signal to the overall loop. This modification in the loop structure has two advantages. Firstly it reduces the amplitude of the signal input to the integrator, making the circuit more tolerant of circuit non-idealities. Secondly, it reduces the size of the signal at the integrator output, so reducing the input signal range for the following quantizer, which in turn means that a given resolution in the latter quantizer can be achieved at lower cost in quantizer complexity and power consumption. These advantages are particularly important where multibit quantizers are used.

Figure 5:
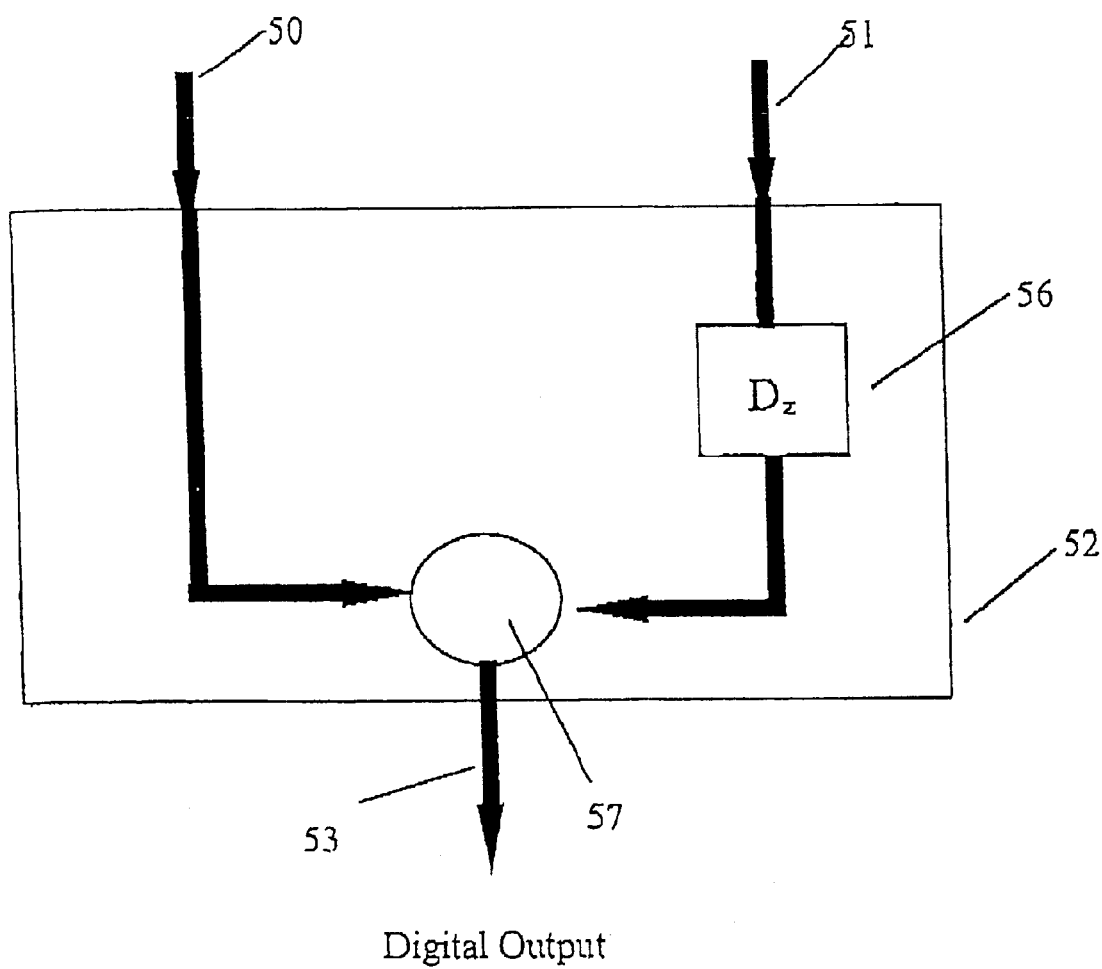
FIG. 5 shows a digital combiner from the subranging sigma delta modulator of FIG. 4.

The present invention is not limited to the particular embodiments described above. Various changes and modifications may be made within the spirit and scope of the invention. For example, the filter described in FIG. 3 may consist of any suitable circuitry which produces a desired filter response and is not limited to simple integrators, or the third quantizer 71 of FIG. 7 may itself comprise a structure according to FIGS. 3, 5, 7 or other similar structures.

What is claimed is:

1. An analog to digital converter for converting an analog input signal to a digital output signal, comprising:
   a first converter which comprises a first filter of a first filter means for producing at least one filter output signal by filtering the difference between the analog input signal and a feedback signal generated from a first digital output,
   a first quantizer for producing the first digital output by quantizing the weighted sum of a first filter output from the first filter means and the analog input signal,
   a second converter for producing a second digital output by converting a second filter output from a second filter of the first filter means, and
   a digital combiner for combining the first output digital signal and the second output digital signal into the digital output signal.

2. An analog to digital converter according to claim 1, wherein the digital combiner includes a differentiator for differentiating the second digital output before combining the first digital output and second digital output into the digital output signal.

3. An analog to digital converter according to claim 1, wherein the digital combiner includes a delay element for delaying the first digital output before combining the first digital output and second digital output into the digital output signal.

4. An analog to digital converter according to claim 1, wherein the first filter means comprises at least one integrator.

5. An analog to digital converter according to claim 1, wherein the first filter means comprises two integrators in series, whereby the output of the first integrator is the input to the second integrator and the second filter output is the output of the second integrator.

6. An analog to digital converter according to claim 5, wherein the first filter output is a weighted combination of the outputs from the first integrator and second integrator.

7. An analog to digital converter according to claim 5, wherein the digital combiner includes a double differentiator for differentiating the second digital output twice before combining the first digital output and second digital output into the digital output signal.

8. An analog to digital converter according to claim 5, wherein the digital combiner includes delay element for delaying the first digital output before combining the first digital output and second digital output into the digital output signal.

9. An analog to digital converter according to claim 1, wherein the second converter comprises
   a second filter means for producing at least one filter output signal by filtering, the difference, between the analog input signal and a feedback signal generated from a first digital output,
   a quantizer for producing the second digital output by quantizing the weighted sum of a third filter output from the second filter means and the analog input signal.

10. An analog to digital converter according to claim 9, further comprising:
    a third converter having an input connected to a second output of said second filter means and producing a third digital output, wherein the digital combiner includes means for combining the third digital signal with the first output digital signal and the second output digital signal into the digital output signal.

11. An analog to digital converter according to claim 10, wherein the digital combiner includes delay elements for delaying the first digital output and second digital output before combining the first digital output and second digital output and third digital output into the digital output signal.

12. An analog to digital converter according to claim 10, wherein the digital combiner includes a differentiator for differentiating the second digital output and a double differentiator for differentiating the third digital signal before combining the first digital output, second digital output and third digital output into the digital output signal.

13. A sigma delta modulator for converting an analog input signal to an output digital signal
    a) a first quantising means for quantising a first analog signal for a first digital signal,
    b) a first digital to analog converter for converting the first digital signal to a second analog signal,
    c) a first summing means, for subtracting the second analog signal from the analog input signal,
    d) an integrating means for integrating the output signal from the first summing means,
    e) a second quantising means for quantising the output of the integrating means to a second digital signal,
    f) a second digital to analog converter for converting the second digital signal to a third analog signal,
    g) a second summing means for subtracting the third analog signal from the analog input signal to provide the first analog signal, and
    h) a combination means for combining the first digital signal and the second digital signal to provide said output digital signal.

14. A sigma delta modulator for converting an analog input signal to an output digital signal, comprising;
    a) first quantising means for quantising a first analog signal to provide a first digital signal,
    b) a digital to analog converter for converting said first digital signal to a second analog signal,
    c) summing means, for associating said second analog signal and said analog input signal,
    d) second quantising means for quantising the output of said summing means to provide a second digital signal; and
    e) amplifier means located between said summing means and said second quantising means, characterised in that the modulator further comprises;
       i) a second digital to analog converter for converting said second digital signal to provide a third analog signal, and
       ii) second summing means for associating said third analog signal with said analog input signal to provide said first analog signal, and further characterised by;
       iii) said amplifier defining an integrating means.

* * * * *